United States Patent
Verbeeck et al.

(10) Patent No.: US 9,018,596 B2
(45) Date of Patent: Apr. 28, 2015

(54) CHARGED PARTICLE VORTEX WAVE GENERATION

(71) Applicant: Universiteit Antwerpen, Antwerp (BE)

(72) Inventors: Johan Verbeeck, Hever (BE); Gustaaf Van Tendeloo, Kessel (BE)

(73) Assignee: Universiteit Antwerpen, Antwerp (BE)

(*) Notice: Subject to any disclaimer, the term of this patent is extended or adjusted under 35 U.S.C. 154(b) by 0 days.

(21) Appl. No.: 14/366,564

(22) PCT Filed: Dec. 19, 2012

(86) PCT No.: PCT/EP2012/076232
§ 371 (c)(1),
(2) Date: Jun. 18, 2014

(87) PCT Pub. No.: WO2013/092762
PCT Pub. Date: Jun. 27, 2013

(65) Prior Publication Data
US 2014/0346353 A1    Nov. 27, 2014

(30) Foreign Application Priority Data
Dec. 20, 2011 (GB) ................................ 1121859.1

(51) Int. Cl.
*H01J 37/04* (2006.01)
*H01J 37/26* (2006.01)
(Continued)

(52) U.S. Cl.
CPC ......... *H01J 37/04* (2013.01); *H01J 2237/2614* (2013.01); *H01J 3/02* (2013.01);
(Continued)

(58) Field of Classification Search
CPC .............. H01J 2237/2614; H01J 37/04; H01J 2237/06383; H01J 37/06; H01J 37/261; H01J 2237/15; H01J 2237/24564; H01J 37/263; H01J 37/265

USPC ........... 250/396 R, 423 R, 424, 397, 286, 297
See application file for complete search history.

(56) References Cited

U.S. PATENT DOCUMENTS 5,563,415 A   10/1996  Crewe
7,851,757 B2  12/2010  Nagayama
(Continued)

FOREIGN PATENT DOCUMENTS

EP       1950789 A1    7/2008
WO    96/41362 A1    12/1996

OTHER PUBLICATIONS

Bliokh, Konstantin, et al., "Semiclassical Dynamics of Electron Wave Packet States with Phase Vortices", The American Physical Society, Physical Review Letters, vol. 99, No. 19, Nov. 9, 2007, pp. 190404-1-190404-4.

Uchida, Masaya et al., "Generation of Electron Beams Carrying Orbital Angular Momentum", Nature, Macmillan Publishers Limited, vol. 464, No. 7289, Apr. 1, 2010, pp. 737-739.

(Continued)

*Primary Examiner* — Nikita Wells
(74) *Attorney, Agent, or Firm* — Workman Nydegger

(57) ABSTRACT

A device for imparting an orbital angular momentum to a charged particle wave propagating along a beam axis in a charged particle beam generating apparatus is described. The device comprises a support element having a target region adapted for transmitting a charged particle wave propagating along a beam axis and an induction means for inducing a magnetic flux along an elongated profile having a free end portion located in the target region and the induction means is adapted for providing a magnetic flux in the elongated profile in order to induce an angular gradient, relative to the beam axis, of the phase of the charged particle wave when transmitted through the target region. A corresponding method is also disclosed, as well as the use thereof in electron microscopy.

20 Claims, 5 Drawing Sheets

(51) Int. Cl.
*H01J 3/02* (2006.01)
*H01J 37/06* (2006.01)
*H01J 37/08* (2006.01)
*H01J 37/256* (2006.01)

(52) U.S. Cl.
CPC ............... *H01J 3/021* (2013.01); *H01J 37/06* (2013.01); *H01J 37/08* (2013.01); *H01J 37/256* (2013.01); *H01J 2237/06383* (2013.01); *H01J 37/261* (2013.01)

(56) References Cited

U.S. PATENT DOCUMENTS

2009/0168142 A1 7/2009 Nagayama
2014/0028220 A1* 1/2014 Bromberg et al. ............ 315/502
2014/0346354 A1* 11/2014 Verbeeck et al. ............. 250/307

OTHER PUBLICATIONS

Verbeeck, J. et al., "Production and Application of Electron Vortex Beams", Nature, Macmillan Publishers Limited, vol. 467, No. 7313, Sep. 16, 2010, pp. 301-304.
Wolny, F., et al., "Quantitative Magnetic Force Microscopy on Permalloy Dots Using an Iron Filled Carbon Nanotube Probe", Ultramicroscopy, Elsevier, vol. 111, No. 8, May 2, 2011, pp. 1360-1365.
Verbeeck, J., et al., "Atomic Scale Electron Vortices for Nanoresearch", American Institute of Physics, Applied Physics Letters, vol. 99, No. 20, Nov. 2011, pp. 203109-1-203109-3.
Search Report from corresponding GB Application No. 1121859.1, Jul. 17, 2012.
International Search Report from corresponding International Application PCT/EP2012/076232, Mar. 12, 2013.

* cited by examiner

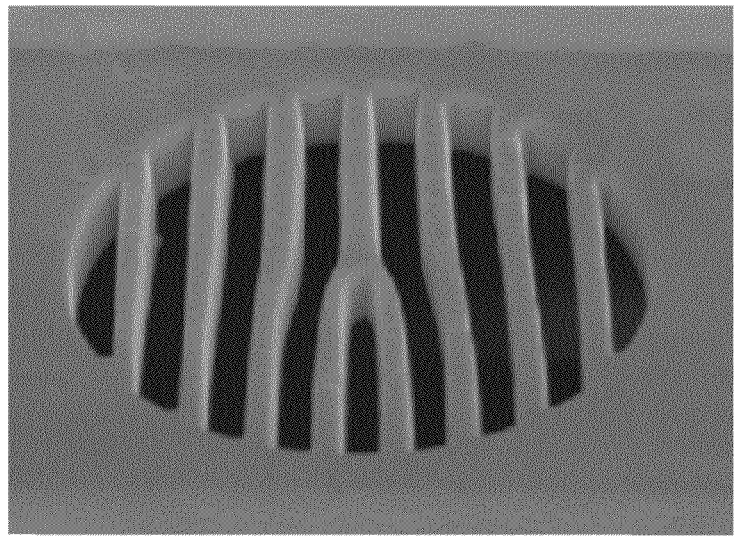
FIG. 1 – PRIOR ART
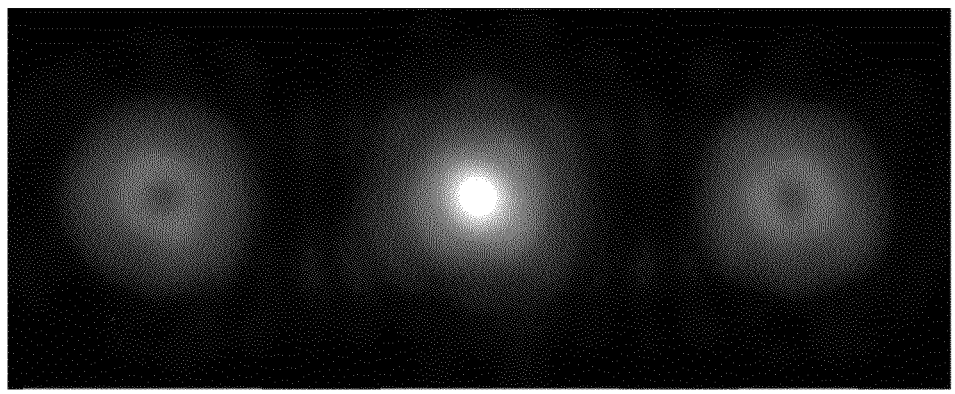
FIG. 2 – PRIOR ART

| | |
|---|---|
| obtaining charged particle wave | 210 |
| Introducing magnetic flux | 220 |
| Impinging on object | 230 |
| Obtaining detection data | 240 |
| Determining information | 250 |
| | 200 |

CHARGED PARTICLE VORTEX WAVE GENERATION

FIELD OF THE INVENTION

The invention relates to the field of charged particle beam manipulation. More specifically it relates to methods and systems for imparting an orbital angular momentum to a charged particle beam, e.g. an electron beam or ion beam.

BACKGROUND OF THE INVENTION

Most wave phenomena encountered in physics textbooks consider planar or spherical waves, which both have in common that their wavefronts form separated planes in space. However, waves of different topology can theoretically exist. An interesting class of such waves are so-called vortex waves, which are also known as waves with a topological charge or waves with a phase singularity.

Vortex waves were first discovered in radio waves and later found many applications in light optics. Such waves carry an orbital angular momentum (OAM) of $m\hbar$ per primary particle, in which the topical charge m is a non-zero integer, e.g. +1 or −1. The orbital angular momentum depends on the spatial distribution of the electromagnetic field, i.e. is carried by the vorticity of the wave and distinct from the angular momentum attributable to polarization.

Vortex waves are used in applications such as quantum information, nano-manipulation and astrophysics. Vortex waves have been obtained from different types of waves, such as radio, acoustic and X-ray waves. Recently, also electron vortex beams have been produced. Electron waves are routinely used in transmission electron microscopes because of their advantageous short wavelength, e.g. of the order of picometers, for kinetic energies of a few hundred keV. This small wavelength of accelerated electrons makes them ideal candidates for creating vortex beams of atomic size. Furthermore, electrons are charged particles and therefore carry a magnetic moment of $m\mu_B$ per electron in addition to the orbital angular momentum of $m\hbar$ per electron. This connection of OAM to magnetism makes them ideal candidates to probe the magnetic state of materials they interact with. In combination with the small wavelengths that can be obtained, this may lead to atomic resolution magnetic mapping of materials.

One application of electron vortex beams may be found in the field of electron energy loss spectroscopy (EELS). EELS is a spectroscopic technique used in transmission electron microscopy to measure the energy loss of the fast electrons when scattering inelastically in a material. The energy loss spectrum contains information about the type of atoms in the material, their chemical bonding, the electronic state and their valency. An attractive feature of EELS is that it can be obtained with a spatial resolution below 1 Å. Atomic resolution EELS experiments have been performed that show atom by atom the constitution of a given material. This is particularly of interest near interfaces and defects in materials.

The available information in EELS may be expanded to include magnetic information by making use of vortex beams, because the conservation of total angular momentum may influence the dipole selection rules that govern the possible excitations in EELS. For example, for ferromagnetic Fe and Co, a spectrum can be obtained that is similar to what is commonly obtained from X ray magnetic chiral dichroism (XCMD). XMCD makes use of absorption differences in circularly polarised X rays, while EELS with vortex electron waves may create the same incoming angular momentum with an electron beam, e.g. an electron wave carrying m=1. However, electron beams have the advantage over X-rays that atomic resolution may be achievable, as is routinely demonstrated in transmission electron microscopy.

It should be noted that a technique that offers magnetic information was already available in EELS under the name of Energy Loss Magnetic Chiral Dichroism (EMCD). EMCD is based on the interference of Bragg scattered electron beams by the crystal combined with inelastic scattering. In a situation with well defined crystal orientation and thickness, a spectrum very close to XMCD could also be obtained. However, precise control over thickness and orientation limits the range of applications in which EMCD can be used. EMCD is furthermore fundamentally limited to a spatial resolution bigger than a few unit cells, e.g. 2 nm, because elastic diffraction is essential in creating the signal. The signal to noise ratio of the technique is furthermore relatively low. Vortex electron beams on the other hand may have no fundamental limit to the maximum spatial resolution, apart from the wavelength, the orientation of the crystal plays no important role because the interference is caused by the vorticity of the beam rather than by Bragg scattering and a substantially larger signal to noise ratio may be achievable. Methods are known in the art to produce electron vortex waves which use holographic reconstruction techniques. Such methods work by illuminating a computer calculated grating structure with a planar electron reference beam to obtain a wave with a predefined phase. The grating is typically cut from a thin metal foil, e.g. a thickness of a few 100 nm of Pt, by using a focused ion beam instrument (FIB). An example of such grating is illustrated in FIG. 1, in which a fork-shaped discontinuity can be seen that may be typical for such gratings. This is an easy method to reproduce, and in principle a grating for any value of m may be produced with this method. However, this method has the disadvantage that the grating simultaneously produces three output beams, as shown by the electron intensity as obtained from such grating in the far field depicted in FIG. 2: the vortex wave of interest, the reference beam and the complex conjugate of the vortex wave of interest, i.e. a vortex wave of opposite handedness. This means that the total electron current available is distributed over the three beams. Furthermore, the grating may typically only transmit about 50% of the electrons, which further reduces the available current in the vortex beam of interest, e.g. to a maximum of ⅛ of the total current. A sufficient current may for example be important for obtaining a high signal to noise ratio. Since these three beam components are simultaneously present, it may be difficult to isolate a signal coming from the vortex beam of interest. It may be possible to overcome this disadvantage with other apertures which select only the beam of interest, for example a spiral aperture may be used.

An alternative method known in the art to produce vortex electron beams is by making use of a phase grating, which is similar to a phase grating for photons, but for electrons the grating substrate has to be extremely thin to produce a phase shift of $2\pi$, e.g. less than 100 nm. This means that contamination on such a grating may deteriorate its function over time as the phase will change without further actions being taken.

SUMMARY OF THE INVENTION

It is an object of the present invention to provide good and efficient means and methods for providing an electron vortex beam.

It is an advantage of embodiments of the present invention that a vortex wave may be obtained having a high particle current.

It is an advantage of embodiments of the present invention that an isolated charged particle vortex wave may be provided, e.g. that a reference wave may be transformed into a vortex wave without generating secondary waves.

It is an advantage of embodiments of the present invention that a device for producing charged particle vortex waves may be provided that can be easily installed in pre-existing equipment, e.g. an electron microscope. It is a further advantage of embodiments of the present invention that such an add-on to an existing system may be produced in a cost-efficient manner while considerably improving the capabilities of the system.

It is an advantage of embodiments of the present invention that a vortex wave may be provided having an orbital angular momentum that is tunable, e.g. that may be controlled by a controllable external signal. It is a further advantage of embodiments of the present invention that a vortex wave may be provided having an orbital angular momentum that may be altered rapidly, e.g. which allows for rapid computer-controlled switching.

The above objective is accomplished by a method and device according to the present invention.

In a first aspect, the present invention provides a device for imparting an orbital angular momentum to a charged particle wave propagating along a beam axis in a charged particle beam generating apparatus. This device comprises a support element having a target region adapted for transmitting a charged particle wave propagating along a beam axis, and an induction means for inducing a magnetic flux wherein said induction means is adapted for providing a magnetic flux according to or along an elongated profile in order to induce an angular gradient, relative to the beam axis, of the phase of the charged particle wave when transmitted through said target region.

The device may comprise a magnetic conductor for conducting a magnetic flux according to an elongated profile and the magnetic conductor may comprise an elongated protrusion having a free end portion located in the target region. The induction means may be adapted for inducting the magnetic flux along the elongated profile by providing a magnetic flux in the elongated protrusion of the magnetic conductor.

In a device according to embodiments of the present invention, the free end portion of the elongated protrusion may be located in a substantially central position of the target region.

In a device according to embodiments of the present invention, the free end portion of the elongated protrusion may be adapted in location for, when the charged particle wave is transmitted through the target region, positioning the free end portion in a substantially transversally central point of the charged particle wave relative to the beam axis.

In a device according to embodiments of the present invention, the support element may comprise an aperture for constricting the transverse cross section, relative to the beam axis, of the charged particle wave to the target region.

In a device according to embodiments of the present invention, the induction means may be adapted for providing a magnetic flux in the elongated protrusion such that the angular gradient of the phase of the charged particle wave is substantially equal to an integer phase shift per unit angle.

In a device according to embodiments of the present invention, the elongated protrusion may have a diameter of less than 5 μm.

In a device according to embodiments of the present invention, the magnetic conductor may be composed of a metal alloy of high magnetic permeability and low magnetic coercivity. Examples of materials that can be used are Si-steel, Ni, NdFeB, . . . . The coercivity plays less of a role on the small scale of the device since a single magnetic grain can not be demagnetized and therefore always has a strong coercivity.

In a device according to embodiments of the present invention, the induction means may comprise a solenoid around an induction part of the magnetic conductor.

In a device according to embodiments of the present invention, the induction part of the magnetic conductor may have a diameter between 10 μm and 3 mm.

In a device according to embodiments of the present invention, the magnetic conductor may be shaped such as to decrease smoothly in diameter from the induction part to the elongated protrusion.

The induction means may also be a conductive foil having a cylindrical shape with an opening along its axial direction, so that the axially oriented edges of the foil do not touch each other, whereby each of the axially oriented edges of the foil is connected to a different low resistivity bar, each of the low resistivity bars functioning as an electrical contact. The induction means thus may form an air-solenoid. The system may operate without magnetic conductor, e.g. have no magnetic conductor. It is an advantage of embodiments allowing operation without magnetic conductor that any flux can be produced while magnetic conductors consist of magnetic domains which will allow less flexibility in tuning the flux exactly to what is needed.

A device according to embodiments of the present invention may furthermore comprise a controller for controlling the magnetic flux induced by the induction means.

In a device according to embodiments of the present invention, the charged particle wave may be an electron wave.

In a second aspect, the present invention provides a method for imparting an orbital angular momentum to a charged particle wave. This method comprises obtaining a charged particle wave propagating in a beam along a beam axis, inducing a magnetic flux along an elongated profile having a free end portion positioned within the charged particle wave, so as to generate an angular gradient, relative to the beam axis, of the phase of the charged particle wave.

Inducing a magnetic flux along an elongated profile may comprise inducing a magnetic flux in a magnetic conductor comprising an elongated protrusion having a free end portion positioned within the charged particle wave.

In a method according to embodiments of the present invention, the angular gradient may be substantially equal to an integer phase shift per unit angle.

The present invention also may further provide a method for characterizing an object, which comprises generating a charged particle wave using a method for imparting an orbital angular momentum to a charged particle wave according to embodiments of the second aspect of the present invention, impinging the charged particle wave on an object, obtaining detection data of the charged particle wave after interaction with the object and determining information about the object taking into account the detection data.

In a method according to embodiments of the present invention, the detection data may comprise an energy distribution as function of wavelength.

The present invention further provides in the use of a method according to embodiments of the second aspect of the present invention in electron microscopy.

In a third aspect, the present invention provides in an electron microscope for obtaining electron microscopy images. The electron microscope comprises an electron source for generating an electron beam and a device according to embodiments of the first aspect of the present invention for imparting an orbital angular momentum to said electron beam.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 1 illustrates a prior-art grating for imparting orbital angular momentum to a planar electron wave.

FIG. 2 illustrates the far field electron density obtained from a prior art grating as shown in FIG. 1.

Figures 3, 4:
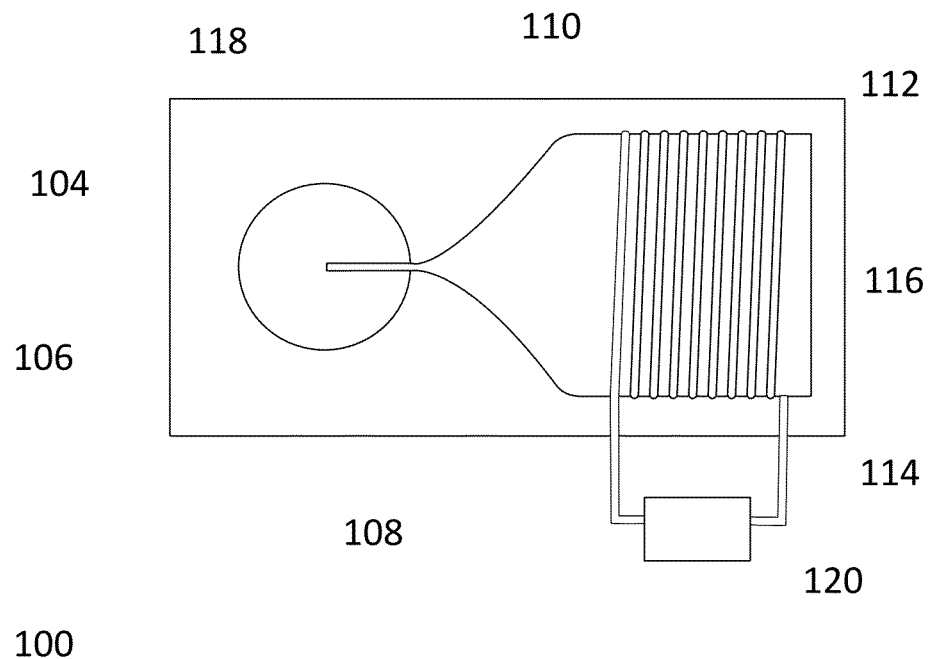
FIG. 3 shows a device for imparting an orbital angular momentum to a charged particle wave using a magnetic flux according to an embodiment of the present invention.
FIG. 4 shows an exemplary method for performing transmission electron microscopy using an electron vortex wave according to an embodiment of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn to scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to orbital angular momentum of a charged particle wave, reference is made to angular momentum carried by a charged particle wave, other than the intrinsic angular momentum of the charged particles, i.e. carried by spin polarization. Beams carrying such orbital angular momentum are also referred to as vortex waves, waves with helical wavefronts, waves having a phase singularity or waves carrying a topological charge.

Where in embodiments of the present invention reference is made to inducing a magnetic flux in a magnetic conductor, reference is made to providing a magnetic field, i.e. a magnetic flux density, in this magnetic conductor. This providing of a magnetic field may comprise both active and passive means for providing. Such active means may comprise, for example, generating a magnetic field by means of applying an electrical current to an induction coil, while passive means may comprise, for example, a permanent magnet.

Figure 5:
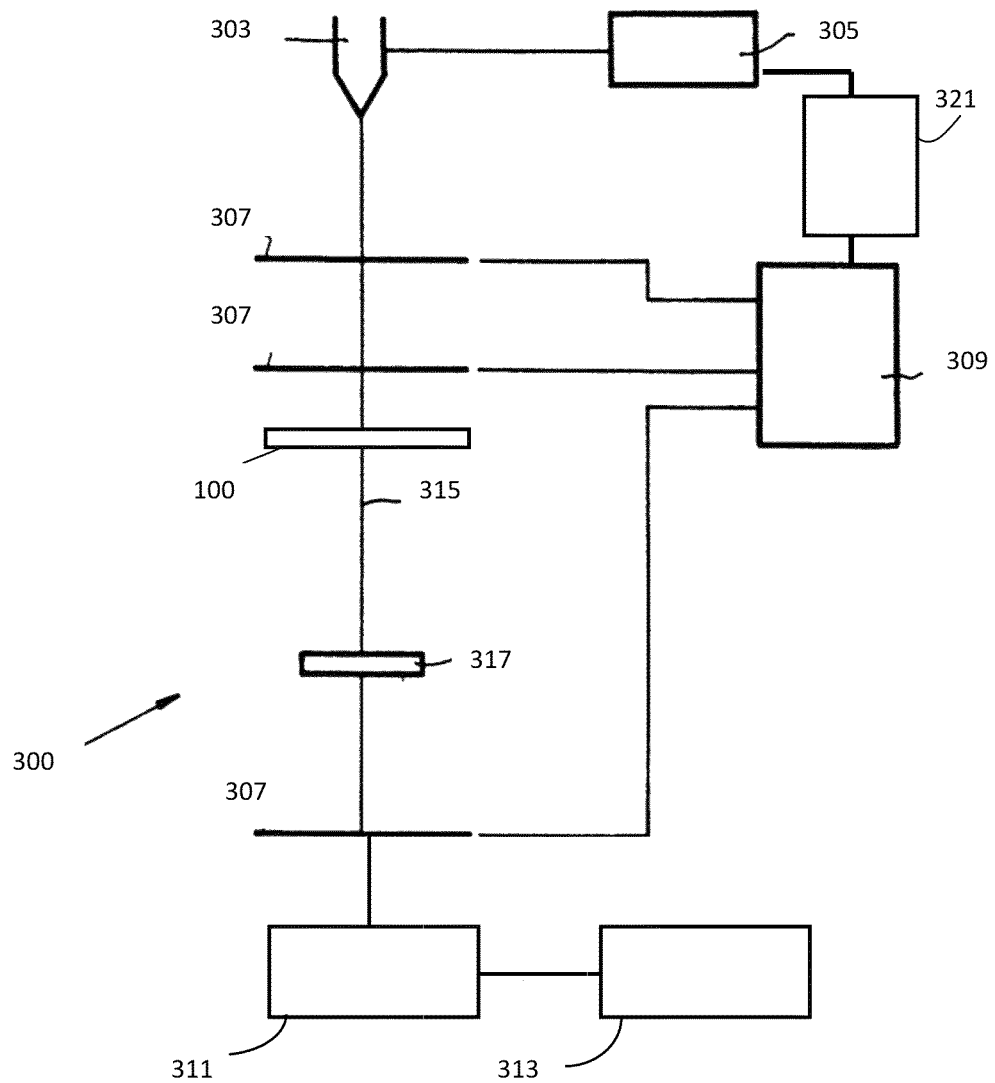
FIG. 5 is a schematic representation of a transmission electron microscope according to an embodiment of the present invention.

In a first aspect, the present invention relate to a device 100 for imparting an orbital angular momentum to a charged particle wave 102 propagating along a beam axis 104 in a charged particle beam generating apparatus. Such charged particle wave 102 may comprise a beam with substantially planar wavefronts, for example a planar electron beam. Particularly, the charged particle beam generating apparatus may be an electron microscope, e.g. a transmission electron microscope 300 such as illustrated in FIG. 5 or a scanning electron microscope. Where further reference is made to electron beams in the present description, it should be noted that principles of the invention are equally applicable to other types of charged particle beams, e.g. ion beams or charged hadron beams, e.g. proton beams, as would be evident to a person skilled in the art. By way of illustration, reference is made to FIG. 3, illustrating an exemplary schematic overview of a device according to an embodiment of the present invention. In embodiments according to the first aspect of the invention, the device 100 comprises a support element 106 having a target region 108 adapted for transmitting a charged particle wave propagating along a beam axis 104. This support element 106 may comprise an aperture for constricting the transverse profile, relative to said beam axis, of the charged particle wave to said target region 108. For example, the support element 106 may comprise a thin plate, for example a thin plate with high stopping power for the charged particles, e.g. a foil. Preferably, such support element 106 may be entirely or partially composed of a non-magnetic material, e.g. having a low magnetic permeability, e.g. having a magnetic permeability substantially equal to the magnetic permeability of vacuum. Such support element 106 may be adapted for transmitting a charged particle wave by providing a target region 108 therein which is transparent to the charged particle wave. For example, the support element 106 may have a hole provided therein to allow charged particles to pass while stopping or strongly attenuating incident charged particles outside this target region 108. Particularly, the support element 106 with target region 108 may provide the function of an aperture in an imaging setup.

The device 100 comprises an induction means 112 for inducing a magnetic flux along an elongated profile in order to induce an angular gradient, relative to the beam axis, of the phase of the charged particle wave when transmitted through said target region. According to embodiments of the present invention, the magnetic flux may be provided along an elongated profile having a free end portion located in the target region. The magnetic flux induction means may be a passive device or an active device. Passive devices typically may be based on permanent magnetic elements for inducing a magnetic flux, whereas active devices for example can be based on the presence of a solenoid whereby a magnetic flux is induced using electrical current through the solenoid. The induction means 112 may in one example of an active device comprise a solenoid wound around an induction part 116 of a magnetic conductor 110. For example, this induction part 116 of the magnetic inductor may be cylindrically shaped, and may have a diameter larger than 10 μm, e.g. several 100 μm, in order to allow easy fabrication, e.g. to allow winding of a thin solenoid wire 114 around the induction part.

In one set of embodiments, the system thus comprises a magnetic conductor 110 for conducting a magnetic flux. This magnetic conductor may be composed of a material having a high magnetic permeability, for example a ferrite compound material, a nickel-iron alloy, such as permalloy or mu-metal, or a amorphous metal alloy of high magnetic permeability, such as metglass. Furthermore, this material may be, e.g. a soft magnetic material. For example, the magnetic conductor may be composed of a high magnetic permeability Fe—Co alloy or Pt alloy. Preferably, the magnetic conductor 110 may be electrically conductive in order to divert charges deposited by an impinging charged particle beam. The magnetic conductor 110 may furthermore be grounded, e.g. electrically connected to a voltage ground, for carrying off excess electrical charge. The magnetic conductor 110 may be shaped such as to decrease smoothly in diameter from the induction part 116 to the elongated protrusion 118. The magnetic conductor may for example be an substantially axially symmetric body, with the induction part 116 at one end, and the elongated protrusion 118 at the other end, having a smooth, e.g. continuously curved, transition profile in between, although embodiments of the present invention are not limited thereto. This may enable an efficient concentration of magnetic flux towards the elongated protrusion 118, e.g. with few eddy effects and field inhomogeneities.

The elongated protrusion 118 extends into the target region 108 and has a free end portion located in this target region 108. The elongated protrusion 118 preferably has a small diameter relative to the dimensions of the target region 108, for example smaller than 10% of the diameter of the target region, and preferably smaller than 1% of the diameter of the target region, e.g. 0.2% of the diameter of the target region. For example, for applications in electron microscopy, the target region 108 may have a diameter between 10 μm and 100 μm, e.g. a diameter of 50 μm, while the elongated protrusion may have a diameter of less than 5 μm, or less than 1 μm, for example 100 nm. The elongated protrusion 118 may for example be manufactured using focused ion beam (FIB) techniques.

The elongated protrusion 118 may extend into the target region 108 and may have a free end portion located in a substantially central point of the target region 108. Particularly, the free end portion may be adapted in location for, when the charged particle wave is transmitted through the target region, positioning the free end portion in a substantially transversally central point of the charged particle wave with respect to the beam axis 104. When a magnetic flux is introduced into the elongated protrusion 118, this generates an angular gradient, relative to the beam axis, on the phase of the charged particle wave when transmitted through the target region 108. The induction means 112 may be adapted for providing a magnetic flux in the elongated protrusion 118 such that the angular gradient of the phase of the charged particle wave is substantially equal to an integer phase shift m per unit angle. For example, the phase shift per unit angle may be within 10% of an integer value, e.g. in the range [0.9,1.1].m with m integer. Therefore, when a substantially planar wave of charged particles interacts with the magnetic field enveloping the elongated protrusion 118, a continuous phase shift over m wavelengths may be obtained over a closed path lying in the plane of the target region 108 and encircling the free end of the elongated protrusion 118, e.g. a circular path concentric with the target region 108. In particular, such a planar wave may be transformed into a vortex wave carrying a topological charge m.

Figure 6A:
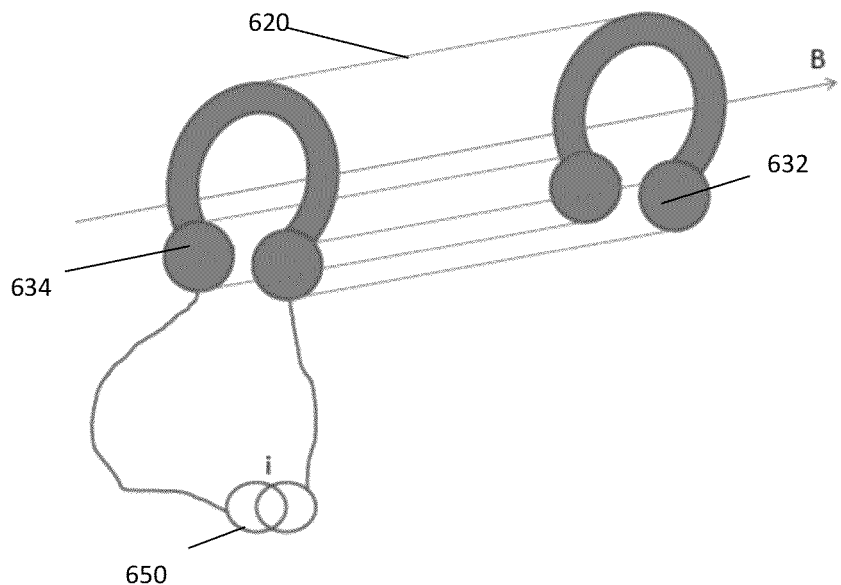
FIG. 6a and FIG. 6b illustrate an induction means acting as air solenoid, i.e. providing a magnetic field along an elongated profile without the need for a magnetic material, as can be used in a system according to an embodiment of the present invention.
Figure 6B:
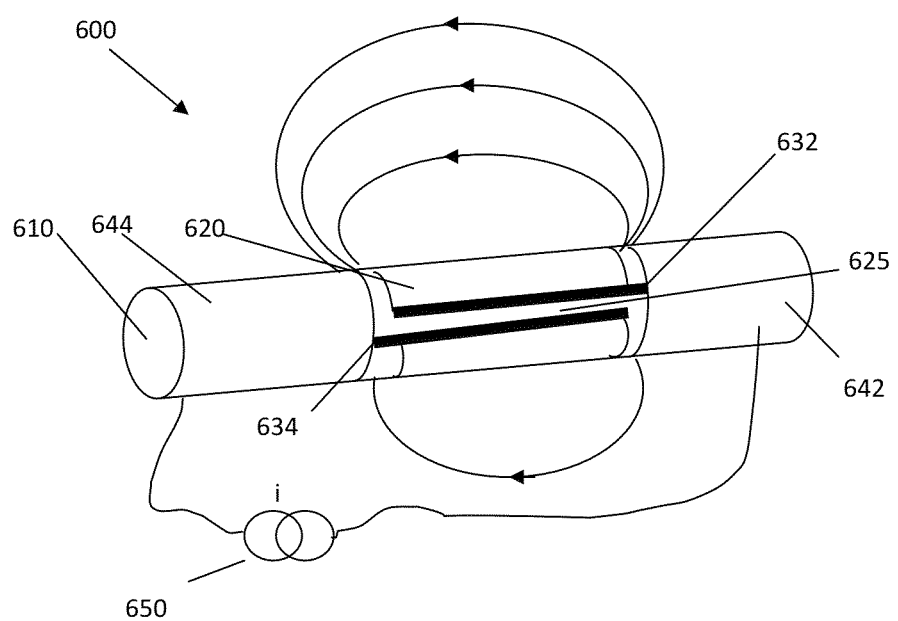

In an alternative embodiment, no magnetic conductor is present. The induction means in such an embodiment may act as an air-solenoid. The induction means then creates itself a magnetic flux along an elongated profile for inducing an angular gradient. More particularly the elongated profile along which the magnetic flux is created may comprise a free end portion located in the target region. One embodiment of such an induction means comprises a conducting foil 620 having an cylindrical shape with an opening 625 along its axial direction so that the axially oriented edges (coinciding with the bars 632, 634) of the foil 620 do not touch each other. Each of the axially oriented edges of the foil thereby is connected to a different low resistivity bar 632, 634, each of the low resistivity bars functioning as an electrical contact. An example of such an air solenoid 600 is shown in FIG. 6a and FIG. 6b. A constant current density in a thin cylindrical conducting foil 620 is created by connecting the foil 620 with low resistivity contact bars 632, 634. Such contact bars 632, 634 typically are much thicker than the foil 620, in order to spread the current evenly. This produces the effect of an infinitely finely wound solenoid without needing to wind a real solenoid. Contacting can be done starting from a metal coated 642, 644 insulating wire 610 (e.g. quartz) in connection with the contact bars 632, 634 and connecting both sides 642, 644 to the current source 650. Such a wire may have a diameter of about 1 μm, although embodiments are not limited thereto. In the middle of the wire, an induction means as described above can be created either lithographically or with FIB. By way of illustration, embodiments of the present invention not being limited thereto, an example thereof is shown in FIG. 6a and FIG. 6b. FIG. 6a illustrates the concept, whereas FIG. 6b illustrates a practical implementation based on a quartz wire, contact points at the left and right part and the air solenoid as described above in the center. The foil material used in the present example is gold. The current needed is in the order of a few ten nA.

The device 100 may furthermore comprise a controller 120 for controlling the magnetic flux induced by the induction means 112. This controller 120 may be adapted for switching the polarity of the induced magnetic field, for example in order to switch the handedness of a vortex wave generated by the device 100. The controller 120 may furthermore adjust the magnetic field strength in order to alter the topological charge m of a vortex wave generated by the device 100. The controller 120 may also adjust the magnetic field strength in order to tune the system, e.g. to obtain an integer phase shift m per unit angle. Such tuning may be advantageous for adapting the system 100 in function of beam parameters, e.g. as function of beam energy. Such tuning may also be advantageous for compensating uncontrolled variables, such as temperature effects or hysteresis.

The device 100 furthermore may comprise a positioning means for outlining the elongated protrusion 118 with respect to the target region. The positioning means may provide the possibility for adapting the relative position between the elongated protrusion 118 and the support structure 106. The controller may be adapted for controlling the positioning means for providing a predetermined relative position between the elongated protrusion 118 and the support structure 106.

In a second aspect, the present invention relates to a method for imparting an orbital angular momentum to a charged particle wave, e.g. a charged particle wave propagating in a beam along a beam axis, such as an electron beam. FIG. 4 shows an exemplary method of characterising an object, making use of a method for imparting an orbital angular momentum according to the second aspect of the present invention. The method 200 comprises obtaining 210 a charged particle wave propagating in a beam along a beam axis 104 and inducing 220 a magnetic flux along an elongated profile. In some embodiments, such a magnetic flux may be created without the need of a magnetic conductor. In other embodiments the means for inducing a magnetic flux may induce a magnetic flux in a magnetic conductor 110 comprising an elongated protrusion 118. Such elongated protrusion 118 comprises a free end portion positioned within the charged particle wave to inject the magnetic flux into the charged particle wave. The inducing means 220 is adapted for generating an angular gradient, relative to the beam axis 104, of the phase of the charged particle wave. This angular gradient may be substantially equal to an integer phase shift per unit angle. The angular gradient may furthermore be substantially constant over a cross section of the charged particle wave, e.g. except for a discontinuity in proximity to the intersection of this cross section with the surface of the elongated protrusion 118. For example, the magnetic flux may be introduced 220 into the charged particle wave with a device 100 according to embodiments of the first aspect of the present invention. The above steps refer to the method for imparting an orbital angular momentum.

The method 200 for characterising an object may further comprise impinging 230 said charged particle wave on an object, obtaining 240 detection data of said charged particle wave after interaction with said object and determining information 250 about said object taking into account said detection data. For example, the method 200 may comprise steps performed for imaging the object, such as transmission electron microscopy imaging. The detection data may comprise an energy distribution as function of wavelength, e.g. for use in electron energy loss spectroscopy.

In a third aspect, the present invention also relates to an electron microscope for obtaining electron microscopy images. The electron microscope 300 according to embodiments of the present invention comprises an electron source 303 for generating an electron beam and a device 100 according to embodiments of the first aspect of the present invention for imparting an orbital angular momentum on the electron beam.

By way of illustration, the present invention not being limited thereto, an example of a transmission electron microscope is shown in FIG. 5. A high-resolution electron microscope 300 is shown comprising an electron source 303 which is fed by a high-voltage generator 305, and also comprises a number of lenses 307 which are fed by a lens power supply source 309. The electron microscope 301 also comprises a detection system 311, the detected information being applied to the image processing system 313. The electron beam 315 is incident on an object 317. High-resolution images of the object 317 can be recorded. The electron microscope 300 also comprises a controller 321 for controlling the imaging. Further features and advantages may be as expressed in other aspects of the present invention.

Working principles of the present invention, the invention not intended to be limited thereby, will be further discussed herein below. Vortex waves contain a phase change of m2π, with m an integer, when going around the vortex axis. Such vortices carry an angular momentum around the vortex axis of $m\hbar$. For simplicity, a vortex axis parallel to the propagation axis of the running wave is assumed, but this is not a necessary condition.

It is known from theory that electron vortex beams can be produced when interacting fast electron waves with a magnetic monopole. A magnetic monopole may be modelled with a Dirac string. Such a Dirac string is an infinitely long and thin solenoid that may be seen as a magnetic dipole with the two poles going further and further apart from each other. Near one end of such a long solenoid a vector potential exists that approximates that of a monopole.

Such an infinitely extended solenoid ending in the centre of an aperture that can be put into a transmission electron microscope would theoretically produce the appropriate magnetic vector potential for transforming a planar electron wave into a vortex wave. Therefore, in embodiments according to the present invention, an induction means, e.g. a solenoid, induces a magnetic flux into a magnetic conductor, e.g. comprising the core around which the solenoid is wound. Such a core may have a size of several 100 µm, which can still easily be manipulated. At one end of the core a very thin and long wire of the same material as the core may be attached. Preferably, the transition from the core to the thin wire should be as smoothly as possible in order to efficiently concentrate and axially align the magnetic field lines along the thin wire. At the tip of this thin wire a field distribution exists that approximates that of a magnetic monopole. When this tip is introduced in the centre of a TEM aperture, electron vortex beams may be produced.

The underlying physical effect may be explained by the Aharonov-Bohm effect, embodiments of the present invention not being limited by theoretical considerations unless mentioned otherwise. The conventional Aharonov-Bohm effect is used in electron holography and states that the phase change $\Delta\phi$ that an electron wave undergoes when going from a point A to a point B depends not only on the electrostatic potential $\phi$, but also on the magnetic vector potential A, related to both macroscopic and microscopic magnetic fields, along its path:

$$\Delta\varphi = \frac{e}{\hbar v}\int_{path}\phi ds + \frac{e}{\hbar}\int_{path}A\cdot ds$$

This phase change depends on the path that is followed. The phase difference between two different paths 1,2 connecting point a to point b depends on the flux $$\frac{e}{\hbar}\oint A\cdot ds = \frac{e}{\hbar}\int B\cdot dS$$

enclosed by both paths 1,2, which is for example exploited in conventional electron holography. It is to be noticed that the phase shift is independent of the speed of the electrons and therefore the proposed device will work equally well on any electron energy crossing SEM and TEM without changes in the flux. This is advantageous over an electrostatic design wherein the electron velocity is an influencing factor. A charged particle vortex wave may be used to gather magnetic information about a material it interacts with. Furthermore, other information about materials may be obtained by observing interactions with charged particle vortex waves, for example about chirality, e.g. to study chiral surface plasmons in meta-materials.

Similar to optical vortex beams, trapping nanoparticles or even single atoms inside an electron vortex beam may be achievable. In optical vortex beams the trapping force is related to the energy of a dielectric medium in the inhomogeneous field of a focussed beam of light, while for electrons, the interaction is more complicated due to the charge which leads to electrodynamic effects involving magnetic and electrostatic fields. The interaction depends in a complicated way on the properties of the material. The magnetic field created by the spiraling probability current of the electron vortex leads to a maximum in the magnetic field at the vortex axis. It can therefore be expected that ferromagnetic particles will get trapped inside an electron vortex beam. Inelastic interactions of the vortex electrons with the particle will transfer angular momentum and can make the particle spin. The angular velocity can quickly build up and reach the level where internal forces surpass the yield point. For a focussed vortex beam, the magnetic field reaches a maximum at the focal plane and in the centre of the vortex beam. Note that the magnetic field of the microscope lenses can be eliminated making use of the so-called Lorentz lens mode. This means that potentially a levitating situation can be realised very similar to the optical trapping of single atoms. A big difference with optical trapping is however the completely different scale of the wavelength, which would allow traps of atomic dimensions possibly leading to forced interactions between particles and/or atoms. Therefore, in some aspects, the present invention also relates to the use of a method for imparting an orbital angular momentum on a charged particle beam for controlling the movement of a particle, e.g. for trapping a particle.

By way of illustration, embodiments of the present invention not being limited thereto, examples are discussed illustrating that small magnetized needles indeed induce a phase shift to electron beams of the symmetry required for vortex beams. It is found that such a phase shift is independent of electron energy, which advantageously allows use for a broad variety of application. It was found that the flux density in real materials can be high enough to cause such an effect, even in rods of only 100 nm diameter.

Figure 7:
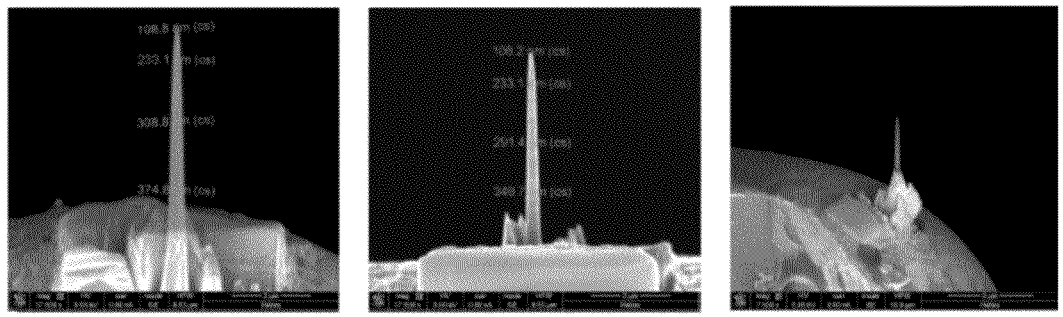
FIG. 7 and FIG. 8 illustrate image of magnetized needles made of Si-steel (left), Ni (center) and Nd permanent magnet (right), as can be used in embodiments of the present invention.

Magnetic needles were made using focussed ion beam processing, one of Si-steel, one of Ni and one of Nd based permanent magnetic material (NdFeB). Examples of such needles are shown in FIG. 7, whereby the Si-steel (right), the Ni (middle) and the Nd permanent magnet tip (left) are shown. This illustrates that appropriate ferromagnetic needles of the desired size can be made, in the present example using focused ion beam (FIB) as manufacturing technique.

Figure 8:
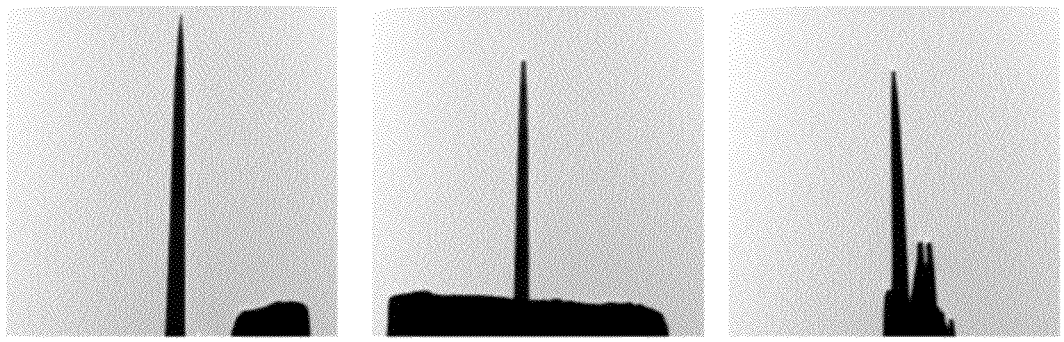
Figure 9:
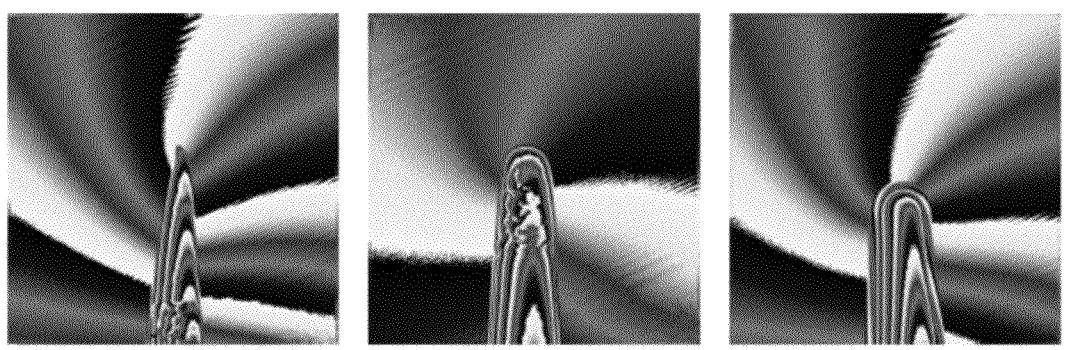
FIG. 9 illustrates electron holography images of the phase of the electron wave for a Si-steel (left), Ni (center) and Nd permanent magnet (right) tip, illustrating features of embodiments according to the present invention.

Further by way of illustration, TEM images (TEM Lorentz—2450 times magnified) of the needles (Si-steel (left), Ni (center), Nd permanent magnet (right) are shown in FIG. 8. The resulting effect on the phase of the electron wave, measured with electron holography is shown in FIG. 9, again for the Si-steel (left), the Ni (center) and the Nd permanent magnet (right) tip. A vortex like phase is created around the tip similar as expected from a long solenoid. Some artefacts in measuring occur due to stray field on the reference beam. The real behaviour is actually closer to theory especially on the sides of the wires. These images show that some common magnetic materials can have more than enough flux density to create higher order vortex beams (as the number of equally phased portions is for each needle higher than 1).

The invention claimed is:
1. A device for imparting an orbital angular momentum to a charged particle wave propagating along a beam axis in a charged particle beam generating apparatus, the device comprising:
 a support element having a target region arranged for transmitting a charged particle wave propagating along a beam axis;
 an induction means configured for inducing a magnetic flux;
 wherein said induction means is arranged for providing a magnetic flux along an elongated profile in order to induce an angular gradient, relative to the beam axis, of the phase of the charged particle wave when transmitted through said target region.

2. A device according to claim 1, wherein said device further comprises a magnetic conductor for conducting a magnetic flux according to an elongated profile, said magnetic conductor comprising an elongated protrusion having a free end portion located in said target region, wherein said inducting means is adapted for inducing the magnetic flux along the elongated profile in the elongated protrusion of the magnetic conductor.

3. A device according to claim 1, in which a free end portion of the elongated profile is located in a substantially central position of said target region.

4. A device according to claim 1, in which said free end portion of said elongated profile is arranged in location for, when said charged particle wave is transmitted through said target region, positioning the free end portion in a substantially transversally central point of said charged particle wave relative to the beam axis.

5. A device according to claim 1, in which said support element comprises an aperture for constricting the transverse cross section, relative to said beam axis, of the charged particle wave to said target region.

6. A device according to claim 1, in which said induction means is adapted for providing a magnetic flux along said elongated profile such that said angular gradient of the phase of the charged particle wave is substantially equal to an integer phase shift per unit angle.

7. A device according to claim 1 in which said elongated protrusion has a diameter of less than 5 μm and/or wherein said magnetic conductor is composed of a metal alloy of high magnetic permeability.

8. A device according to claim 2, in which said induction means comprises a solenoid around an induction part of the magnetic conductor.

9. A device according to claim 8, in which said induction part of the magnetic conductor has a diameter between 10 μm and 3 mm.

10. A device according to claim 8, in which said magnetic conductor is shaped such as to decrease smoothly in diameter from said induction part to said elongated protrusion.

11. A device according to claim 1, wherein the induction means comprising a conducting foil having an cylindrical shape with an opening along its axial direction so that the axially oriented edges of the foil do not touch each other, whereby each of the axially oriented edges of the foil is connected to a different low resistivity bar, each of the low resistivity bars functioning as an electrical contact.

12. A device according to claim 11, wherein the system does not comprise a magnetic conductor and/or wherein the device furthermore comprises a controller for controlling the magnetic flux induced by said induction means.

13. A device according to claim 1, in which said charged particle wave is an electron wave.

14. A method for imparting an orbital angular momentum to a charged particle wave, the method comprising:
  obtaining a charged particle wave propagating in a beam along a beam axis;
  inducing a magnetic flux along an elongated profile, having a free end portion positioned within said charged particle wave, so as to generate an angular gradient, relative to the beam axis, of the phase of the charged particle wave.

15. A method according to claim 14, wherein inducing a magnetic flux along an elongated profile comprises inducing a magnetic flux in a magnetic conductor comprising an elongated protrusion having a free end portion positioned within said charged particle wave.

16. A method according to claim 15, in which said angular gradient is substantially equal to an integer phase shift per unit angle.

17. A method for characterizing an object, the method comprising:
  generating a charged particle wave using a method according to claim 14,
  impinging said charged particle wave on an object,
  obtaining detection data of said charged particle wave after interaction with said object and
  determining information about said object taking into account said detection data.

18. The method according to claim 17, in which said detection data comprises an energy distribution as function of wavelength.

19. The method according to claim 17 for use in electron microscopy.

20. An electron microscope for obtaining electron microscopy images, the electron microscope comprising an electron source for generating an electron beam and a device according to claim 1 for imparting an orbital angular momentum to said electron beam.

* * * * *